United States Patent
Eckhardt et al.

(10) Patent No.: US 10,718,806 B2
(45) Date of Patent: Jul. 21, 2020

(54) HIGH SPEED AND HIGH PRECISION CHARACTERIZATION OF VTSAT AND VTLIN OF FET ARRAYS

(71) Applicant: GLOBALFOUNDRIES INC., Grand Cayman (KY)

(72) Inventors: Uwe Eckhardt, Dresden (DE); Juergen Boldt, Dresden (DE); Matthias Baer, Hohenstein-Ernstthal (DE); Dirk Fimmel, Radebeul (DE); Karl-Heinz Sandig, Dresden (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 253 days.

(21) Appl. No.: 15/299,824

(22) Filed: Oct. 21, 2016

(65) Prior Publication Data
US 2018/0113166 A1     Apr. 26, 2018

(51) Int. Cl.
| | |
|---|---|
| *G01R 31/26* | (2020.01) |
| *H03F 3/45* | (2006.01) |
| *G11C 29/50* | (2006.01) |
| *G11C 29/28* | (2006.01) |
| *G11C 29/48* | (2006.01) |

(Continued)

(52) U.S. Cl.
CPC ........ *G01R 31/2621* (2013.01); *G11C 29/021* (2013.01); *G11C 29/022* (2013.01); *G11C 29/1201* (2013.01); *G11C 29/28* (2013.01); *G11C 29/48* (2013.01); *G11C 29/50* (2013.01);

(Continued)

(58) Field of Classification Search
CPC ..... G11C 29/021; G11C 29/022; G11C 29/48; G11C 29/1201; G11C 29/28; G11C 29/50; G11C 2029/5002; G11C 2029/5004; G01R 31/2621; G01R 31/2648; G01R 31/2623; G01R 31/2603; G01R 31/26

See application file for complete search history.

(56) References Cited

U.S. PATENT DOCUMENTS

| | | | | |
|---|---|---|---|---|
| 5,748,534 A | * | 5/1998 | Dunlap | G11C 11/5642 |
| | | | | 327/54 |
| 2008/0238327 A1 | * | 10/2008 | Cho | G09G 3/3241 |
| | | | | 315/169.3 |

(Continued)

FOREIGN PATENT DOCUMENTS

| | | |
|---|---|---|
| CN | 101819940 | 9/2010 |
| CN | 104965560 | 10/2015 |

(Continued)

OTHER PUBLICATIONS

Taiwanese Office Action in related TW Application No. 106100148 dated Mar. 22, 2018, 10 pages.

(Continued)

*Primary Examiner* — Lee E Rodak
(74) *Attorney, Agent, or Firm* — Michael LeStrange; Andrew M. Calderon; Roberts Calderon Safran & Cole, P.C.

(57) ABSTRACT

The present disclosure relates to circuit structures and, more particularly, to circuit structures which detect high speed and high precision characterization of VTsat and VTlin of FET arrays and methods of manufacture and use. The circuit includes a control loop comprised of a differential amplifier, a plurality of FET arrays, and at least one analog switch enabling selection between a calibration mode and an operation mode.

20 Claims, 4 Drawing Sheets

(51) Int. Cl.
G11C 29/12 (2006.01)
G11C 29/02 (2006.01)
(52) U.S. Cl.
CPC ............... *G11C 2029/5002* (2013.01); *G11C 2029/5004* (2013.01)

(56) References Cited

U.S. PATENT DOCUMENTS

| | | |
|---|---|---|
| 2011/0273946 A1 | 11/2011 | Deng et al. |
| 2014/0340150 A1* | 11/2014 | Dempsey ............... H03F 1/223 330/260 |
| 2015/0027237 A1* | 1/2015 | Chakrabartty ........... G01B 7/18 73/862.68 |
| 2015/0063003 A1* | 3/2015 | Tsukada ............... G11C 13/004 365/148 |

FOREIGN PATENT DOCUMENTS

| | | |
|---|---|---|
| TW | 200518097 | 6/2005 |
| WO | 2013126181 | 8/2013 |

OTHER PUBLICATIONS

Taiwanese Notice of Allowance in related TW Application No. 106100148 dated Aug. 16, 2018, 3 pages.
Chinese Office Action in related TW Application No. 201710970893.6 dated May 17, 2019, 25 pages.
Chinese Office Action in related CN Application No. 201710970893.6 dated Mar. 24, 2020, 10 pages.

* cited by examiner

HIGH SPEED AND HIGH PRECISION CHARACTERIZATION OF VTSAT AND VTLIN OF FET ARRAYS

FIELD OF THE INVENTION

The present disclosure relates to circuit structures and, more particularly, to circuit structures which execute high speed and high precision characterization of VTsat and VTlin of FET arrays and methods of manufacture and use.

BACKGROUND

Field effect transistors (FETs) used in SRAMs and analog circuits (e.g., differential amplifiers, DACs, ADCs) need to have their VTsat and VTlin measured with high precision (<1 mV range) and high speed to characterize/quantify components (devices) on the wafers. The VTsat and VTlin need to be quantified absolutely and relatively between devices to allow a customer to match devices used in e.g., DACs, ADCs, etc.

High precision target is set by mismatch impact on several analog circuits' performance degradation sensitivity. High speed is needed so that as many as possible devices can be measured to determine reliable statistical values in a short time period. This is strongly driven, for instance, by SRAMs.

VTsat and VTlin are measured with static IC test equipment. By way of example, defined drain current Id is forced into the circuit and gate source voltage Vgs has to be set so that defined drain source voltage Vds results. This force and sampling procedure is executed iteratively until Vgs (i.e., VTsat and VTlin) is found for a Vds which is close enough to the defined value. A tradeoff between the number of iterations (test time) and achieved precision of VTsat and VTlin precision has to be made, though. That is, there is a tradeoff between precision measurements and speed of measurements. For example, static test equipment needs sampling times for analog signals in the one to two digit millisecond range.

SUMMARY

In an aspect of the disclosure, a circuit comprises a control loop comprised of a differential amplifier, a plurality of FET arrays, and at least one analog switch enabling selection between a calibration mode and an operation mode.

In an aspect of the disclosure, a control circuit comprises: a differential amplifier; a plurality of FET arrays whose voltage input VGSI is an output of the differential amplifier and whose output voltage VDI is provided as an input to the differential amplifier along with a target input VDS; an array control circuit structured to select a FET array of the plurality of FET arrays in order to receive the voltage input VGSI; and a transistor control circuit structured to provide control signals to select each transistor of the selected FET array.

In an aspect of the disclosure, a circuit comprises: a differential amplifier; a plurality of FET arrays connected to an output of the differential amplifier by a first switch and connected to an input of the differential amplifier by a second switch; and at least one control circuit structured to select a FET array of the plurality of FET arrays and particular transistors in the selected FET array to receive a voltage input VGSI. The voltage input VGSI is an output of the differential amplifier defined by an output voltage VDI of the selected FET array and a target input VDS.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to a circuit and, more particularly, to a circuit structure/design which executes high speed and high precision characterization of VTsat and VTlin of FET arrays (e.g., NFET and PFET arrays) and methods of manufacture and use. More specifically, the circuit structures described herein are structured to determine the exact gate source voltage (VGS) for VTsat and VTlin measurements with a closed control loop realized on silicon die together with an array of devices under test. Advantageously, the circuits described herein realize such measurement by automatic setting/converging to the appropriate VGS immediately after applying VDS and Id within the loop settling time, e.g., within one to two digit microsecond range. In this way, there is no longer a tradeoff between precision measurement and speed of test.

Figure 1:
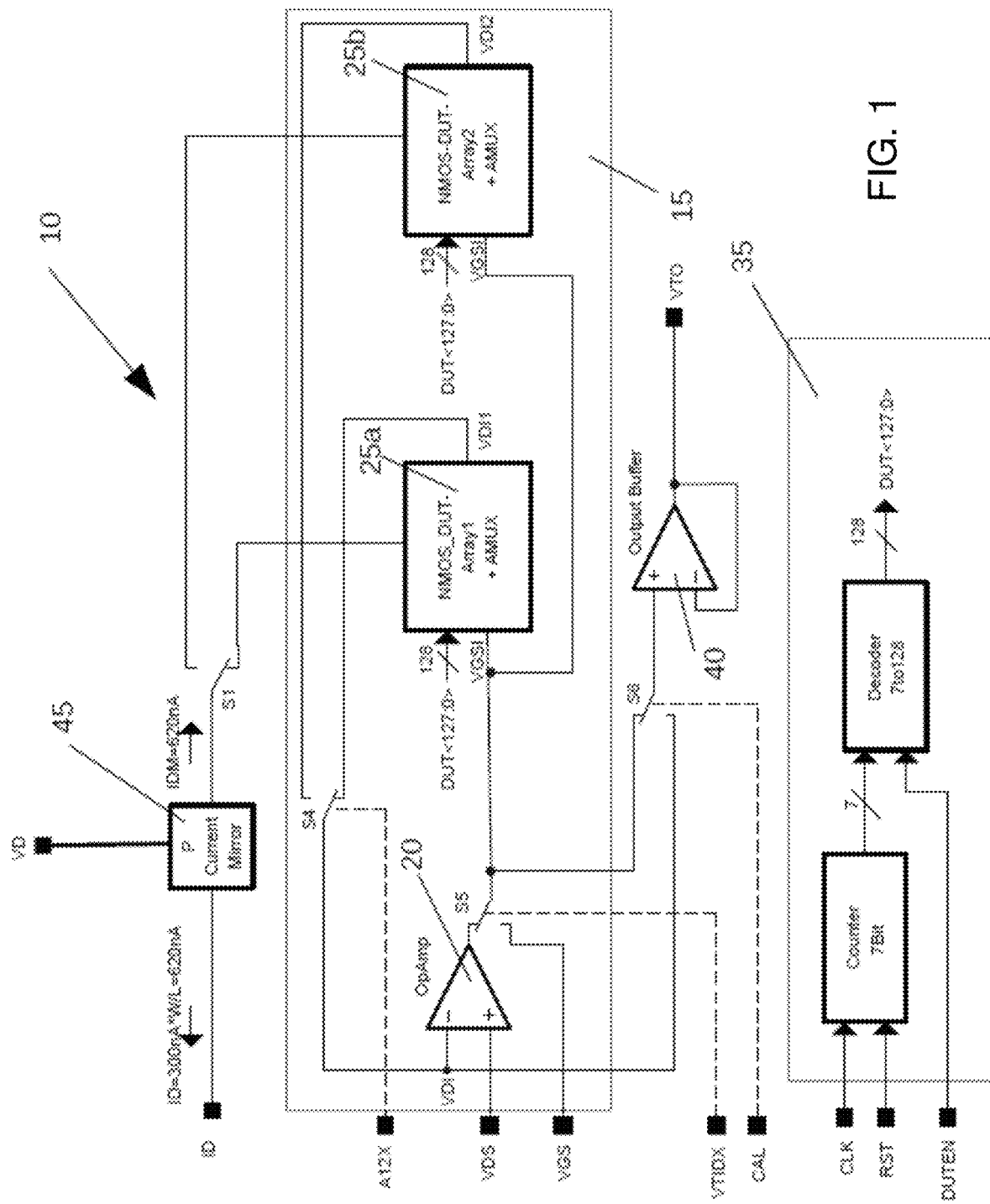
FIG. 1 shows a functional circuit structure with a plurality of NFET arrays in accordance with aspects of the present disclosure.

FIG. 1 shows a functional circuit structure with a plurality of NFET arrays in accordance with aspects of the present disclosure. More specifically, the circuit 10 of FIG. 1 includes a control loop 15 comprised of an appropriately compensated rail-to-rail differential amplifier 20, e.g., opamp, a plurality of NFET arrays with dedicated analog muxes 25a-25n, and analog switches S4, S5 to enable selection between calibration mode and operation mode. In embodiments, the differential amplifier 20, e.g., opamp, has a high linearity, which is capable of finding a value of below 50 millivolts as described further herein. The dedicated analog switches and muxes are structured to ensure leakage current minimization to an amount which does not impact desired measurement precision.

It should be understood by those of skill in the art that although two arrays of NFETs are shown in FIG. 1, any number of NFET arrays and number of NFETs within the arrays can be implemented within the circuit 10, e.g., within control loop 15. For example, any number of NFET arrays can be selected by a combination of different analog switches, similar to the arrangement shown with switch S4. By way of more specific example, each pair of NFET arrays can be connected to a separate analog switch to provide VDI to the input of the differential amplifier 20.

Figure 3:
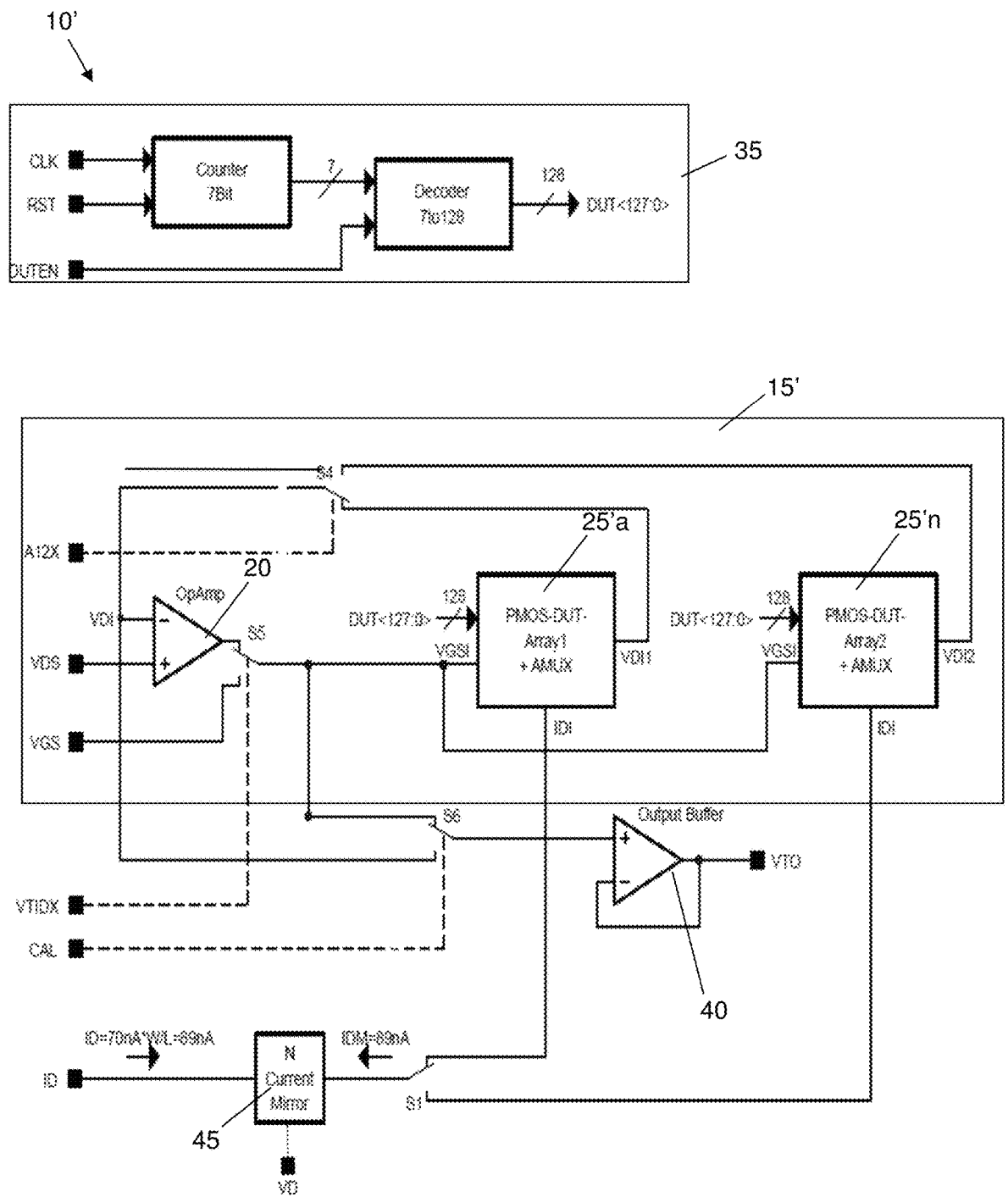
FIG. 3 shows a circuit structure with a plurality of PFET arrays in accordance with additional aspects of the present disclosure.
Figure 4:
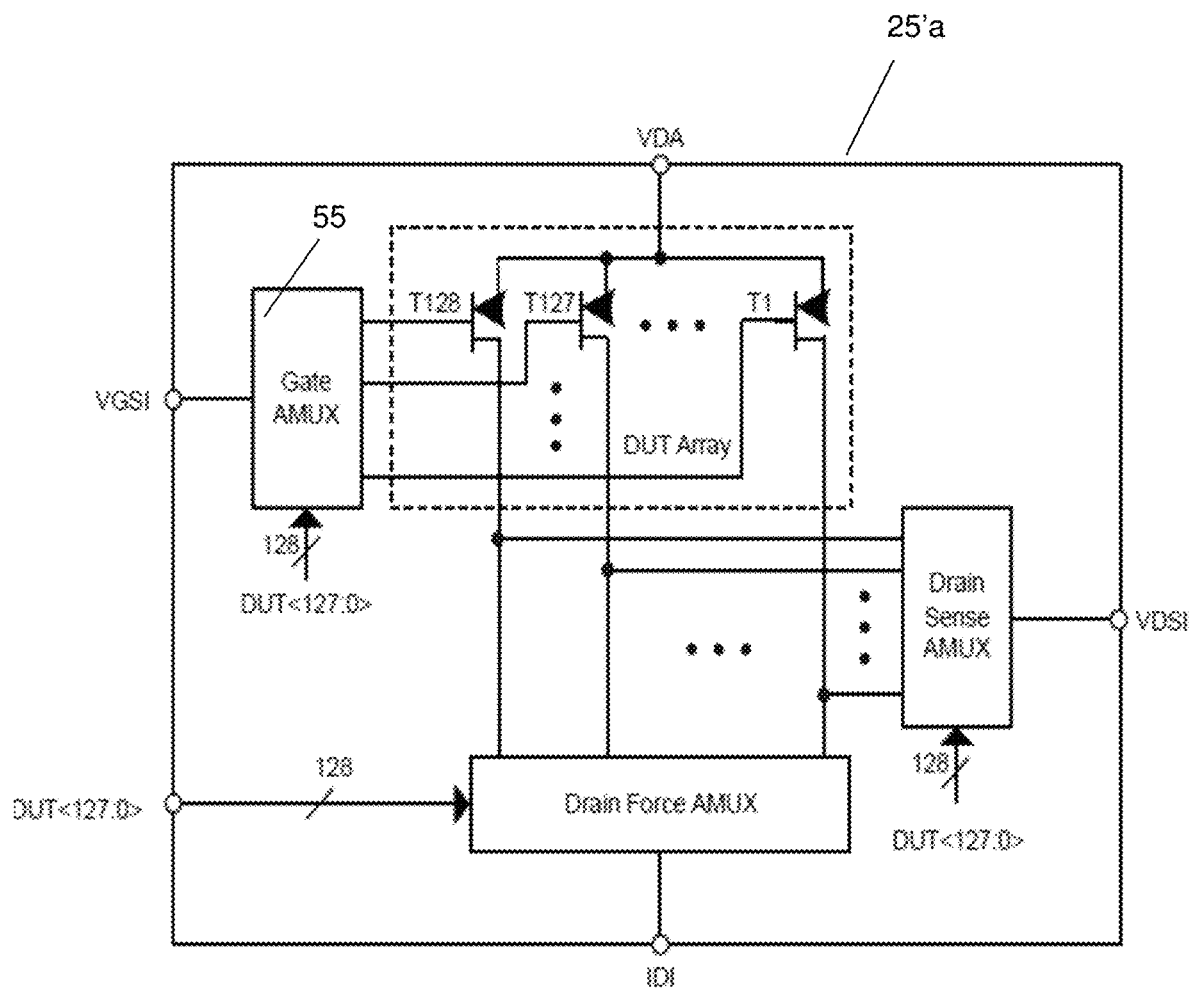
FIG. 4 shows a schematic circuitry of a PMOS-DUT array and MUX implemented in the functional circuit structure of FIG. 3, in accordance with aspects of the present disclosure.

Moreover, although the plurality of NFET arrays 25a-25n are shown as, e.g., 2×128 NFET transistors, different NFET arrays are also contemplated herein, e.g., PFET transistors such as those shown and described with respect to FIGS. 3 and 4, different number of transistors in each array, etc. For example, a different number of transistors can be provided in each array with the understanding that a reduction in the number of transistors in each array will advantageously reduce the maximum leakage current. Accordingly, although not a limiting feature, a target number of transistors in each array is preferably 128.

Still referring to FIG. 1, inputs to the differential amplifier 20 include a target voltage VDS, e.g., 1 volt, and voltage VDI, where voltage VDI is an output voltage of a selected NFET array 25a-25n, e.g., VDI1, VDI2. In embodiments, the voltage VDI of each of the selected NFET arrays 25a-25n is fed back to the differential amplifier 20 by operation of switch S4, resulting in a loop system. As noted above, it should be understood that the output voltage VDI of any of a plurality of NFET arrays 25a-25n can be selected by an analog switch, e.g., switch S4, and fed back to the differential amplifier 20.

The differential amplifier 15 amplifies the difference between the two voltages, e.g., VDS and VDI, and with the one regular input and one inverting input, it multiplies the difference by a constant factor to output voltage VGSI. The output voltage VGSI of the differential amplifier 20 is supplied as the input to each of the plurality of NFET arrays 25a-25n. It should be understood by those of skill in the art that the output voltage VGSI of the differential amplifier 20 is controlled by voltage VDS and voltage VDI. Control circuit 35, on the other hand, is structured to select each of the transistors in the selected FET array 25a-25n, as represented by output <DUT 127:0>.

The circuit 10 further includes a current mirror 45 to force a well defined drain current (IDI) to each NFET in the NFET arrays 25a-25n. In embodiments, operation of switch S1 provides the well defined drain current to a selected one of the NFET arrays 25a-25n. In this way, it is now possible for the current mirror 45 to decouple the current source from the prior unknown capacitance on the tester side current source.

FIG. 1 further shows an output buffer 40, e.g., a rail-to-rail amplifier, structured to appropriately drive measured voltage towards an external probe/tester, e.g., VTO. In embodiments, the buffer offset and nonlinearity can be measured once and used for measurement value compensation in the microsecond time frame, e.g., within the loop settling time. In embodiments, the settling time of the loop 15 can be fully exploited by placing the circuit in a common DAC/ADC interface and reduce tester communication to pure digital signals with the resulting option of speeding up of the tester DUT channels.

In embodiments, buffer offset is a measured offset of voltage VDS and voltage VDI (e.g., VDI1 or VDI2). In embodiments, voltage VDS is a known value, e.g., 1 volts, and voltage VDI is the output of a selected NFET array 25a-25n. In embodiments, operation of switch S6 provides the output voltage VDI of the selected NFET array 25a-25n to the output buffer 40 for measurement. Also, a combination of switches, e.g., switches S5, S6, can provide the output voltage VGSI of the differential amplifier 20 to the output buffer 40.

Figure 2:
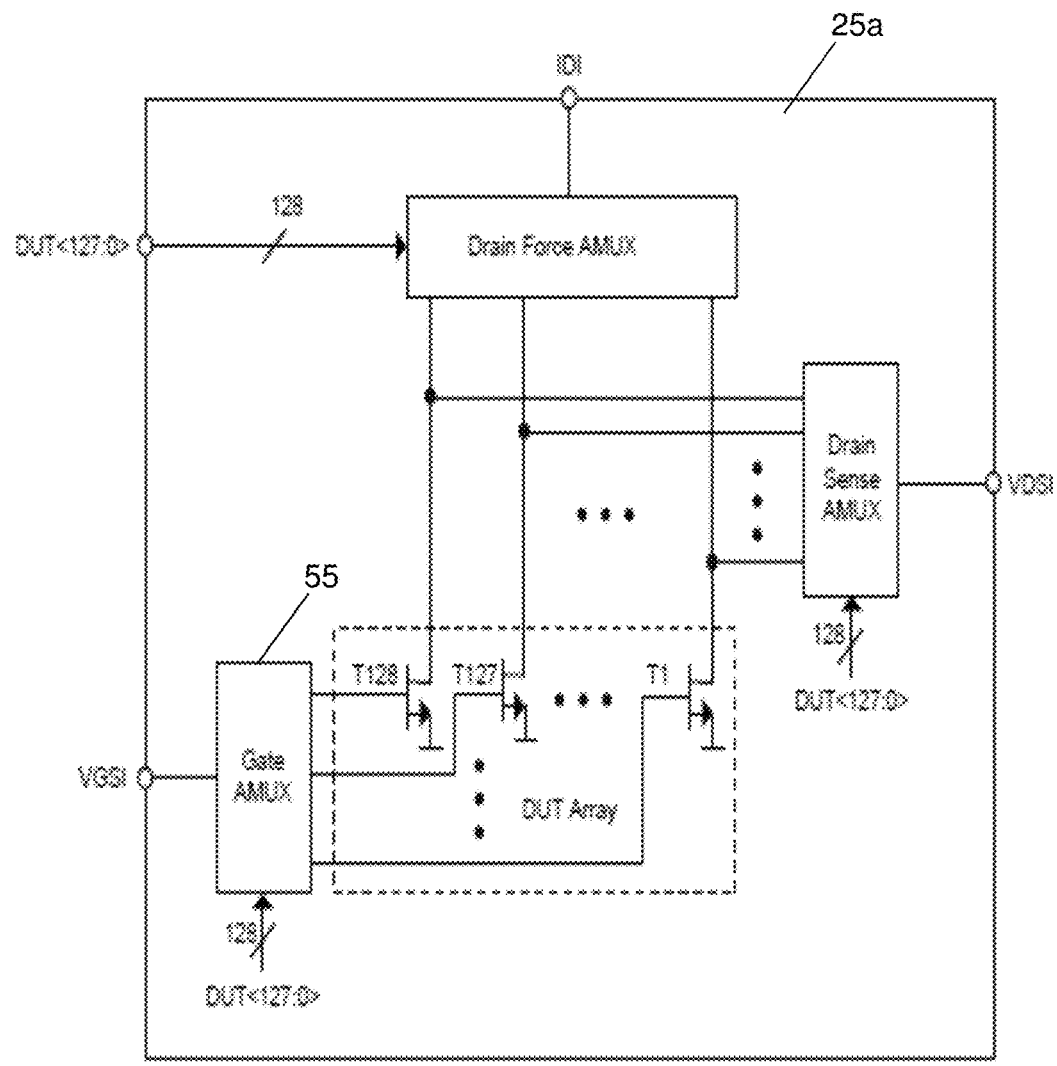
FIG. 2 shows a schematic circuitry of a NMOS-DUT array and MUX implemented in the functional circuit structure of FIG. 1, in accordance with aspects of the present disclosure.

FIG. 2 shows a schematic circuitry of a NMOS-DUT array and MUX implemented in the functional circuit structure of FIG. 1, in accordance with aspects of the present disclosure. More specifically, FIG. 2 shows a detailed circuitry of the NFET array 25a of FIG. 1, comprising transistors T128, T127 . . . T1. It should be understood by those of skill in the art that each of the each NFET arrays 25a-25n have a similar structure such that an explanation of a single array should suffice for a complete understanding thereof.

As shown in this representative circuitry of FIG. 2, voltage VGSI (output voltage of the differential amplifier 20) is fed to a gate mux 55. The gate mux 55 is controlled by control signals received by the control circuit 35 (represented by input DUT<127:0>) in order to separately provide voltage VGSI to a selected (turn on) transistor T128, T127 . . . T1. In this way, voltage VGSI can be provided individually to a selected transistor, e.g., T128, while the remaining transistors, e.g., T127 . . . T1, are turned off. Accordingly, it is now possible to provide VDI for each transistor and measure the offset to adjust VGSI within a settling time of the loop. Moreover, the well defined current IDI (from the current mirror 45) is fed into the circuit and, more specifically, into the selected one of the transistors T128, T127 . . . T1. The voltage VDSI is the output of the array 25a. In a PFET array, the well defined current IDI will be pulled out of each of the transistors T128, T127 . . . T1 of the array.

FIG. 3 shows a circuit structure with a plurality of PFET arrays in accordance with additional aspects of the present disclosure. More specifically, the circuit 10' of FIG. 3 includes a control loop 15' comprised of an appropriately compensated rail-to-rail differential amplifier 20, e.g., opamp, a plurality of PFET arrays with dedicated analog muxes 25'a-25'n, and analog switches S4, S5 to enable selection between calibration mode and operation mode. As previously noted, the differential amplifier 20, e.g., opamp, has a high linearity, which is capable of finding a value of below 50 millivolts. The dedicated analog switches and muxes are structured to ensure leakage current minimization to an amount which does not impact desired measurement precision.

It should be understood by those of skill in the art that although two arrays of FETs are shown in FIG. 3, any number of PFET arrays and number of PFETs within the arrays can be implemented within the circuit 10', e.g., within control loop 15'. For example, any number of PFET arrays can be selected by a combination of different analog switches, similar to the arrangement shown with switch S4. By way of more specific example, each pair of PFET arrays can be connected to a separate analog switch to provide VDI to the input of the differential amplifier 20. Moreover, although the plurality of PFET arrays 25'a-25'n are shown as, e.g., 2×128 PFET transistors, different PFET arrays are also contemplated herein as already described herein.

Still referring to FIG. 3, inputs to the differential amplifier 20 include a target voltage VDS, e.g., 1 volt, and voltage VDI, where voltage VDI is an output voltage of a selected PFET array 25'a-25'n, e.g., VDI1, VDI2. In embodiments, the voltage VDI of each of the selected PFET arrays 25'a-25'n is fed back to the differential amplifier 20 by operation of switch S4, resulting in a loop system. As noted above, it should be understood that the output voltage VDI of any of a plurality of PFET arrays can be selected by an analog switch, e.g., switch S4, and fed back to the differential amplifier 20'.

The differential amplifier 20 amplifies the difference between the two voltages, e.g., VDS and VDI, and with the one regular input and one inverting input, it multiplies the difference by a constant factor to output voltage VGSI. The output voltage VGSI of the differential amplifier 20 is supplied as the input to each of the plurality of PFET arrays 25'a-25'n. It should be understood by those of skill in the art that the output voltage VGSI of the differential amplifier 20 is controlled by voltage VDS and voltage VDI. Control circuit 35, on the other hand, is structured to select each of the transistors in the selected FET array 25'a-25'n, as represented by output <DUT 127:0>.

The circuit 10' further includes a current mirror 45. In embodiments, the well defined current IDI will be pulled out of each of the transistors of the PFET arrays 25'a-25n by the current mirror 45. In embodiments, operation of switch S1 can be turned ON so as to pull the drain current from a selected PFET for the PFET arrays 25'a-25'n. Similar to the circuit of FIG. 1, the output buffer 40, e.g., a rail-to-rail amplifier, is structured to appropriately drive measured voltage towards an external probe/tester, e.g., output pin VTO. In embodiments, the buffer offset and nonlinearity can be measured once and used for measurement value compensation in the microsecond time frame, e.g., within the loop settling time. In embodiments, the settling time of the loop 15' can be fully exploited by placing the circuit in a common DAC/ADC interface and reduce tester communication to pure digital signals with the resulting option of speeding up of the tester DUT channels. In embodiments, the buffer offset is a measured offset of voltage VDS and voltage VDI (e.g., VDI1 or VDI2). In embodiments, voltage VDS is a known value, e.g., 1 volt, and voltage VDI is the output of a selected PFET array 25'a-25'n by operation of switch S6. Also, a combination of switches, e.g., switches S5, S6, can provide the output voltage VGSI of the differential amplifier 20 to the output buffer 40.

FIG. 4 shows a schematic circuitry of a PMOS-DUT array and MUX implemented in the functional circuit structure of FIG. 3, in accordance with aspects of the present disclosure. More specifically, FIG. 4 shows a detailed circuitry of the PFET array 25'a of FIG. 3, comprising transistors T128, T127 ... T1. It should be understood by those of skill in the art that each of the PFET arrays 25'a-25'n have a similar structure such that an explanation of a single array should suffice for a complete understanding hereof.

As shown in this representative circuitry of FIG. 4, voltage VGSI is fed to a gate mux 55. The gate mux 55 is controlled by control signals received by the control circuit 35 (represented by input DUT<127:0>) in order to separately provide voltage VGSI to a selected (turn on) transistor T128, T127 ... T1. In this way, voltage VGSI can be provided individually to a selected transistor, e.g., T128, while the remaining transistors, e.g., T127 ... T1, are turned off. The well defined current IDI is pulled from the selected one of the transistors T128, T127 ... T1 and provided to the current mirror 45. The voltage VDSI is the output of the PFET array 25'a.

Referring to the circuits of FIGS. 1-4, the output buffer 40 is used to transfer internal voltages to the output pin, VTO. In order to achieve a sufficient measurement accuracy the offset and the gain of the output buffer 40 should be determined by measuring the transfer characteristic at selected number of points, N. In embodiments, the number of points N depends on the required measuring accuracy related to the operating range. In embodiments, the output buffer offset measurement of VGS is provided in 50 mV steps from 0 to VDA, for each incremental step.

By way of specific, non-limiting example, in a first increment, VGS is set to equal VGS(1), e.g. 50 mV, and VT1 (e.g., the first measured voltage at output pin, VTO) is measured. In a second increment, VGS is set to equal to VGS(2), e.g. 100 mV, and VT2 (e.g., the second measured voltage at output pin, VTO) is measured. In subsequent steps, VGS is increased step by step and VTO(N) is measured at the output pin for the remaining N-2 points. In embodiments, the step size is, e.g., 50 mV and the operating range is, e.g., 0V to 1.1V. In this way, the measured transfer characteristic allows the calculation of offset and gain, with these values being used to correct the measured voltages at VTO by post processing.

Referring to the circuits of FIGS. 1 and 3, the calibration of the current mirror 45 can then performed, e.g., before VTlin-, VTsat-measurements. More specifically, current mirror mismatch measurements can be performed for calibration with the active FETs. For example, to calibrate the current mirror 45, the target current IDVT is pulled from ID and current, IDLS, is measured from the voltage source, VD. In embodiments, the offset current to be applied to ID is IDM_target-(IDLS-IDVT). In a more specific example, the mirrored current is IDM=IDLS-IDVT. If IDM is ≠IDVT, the IDVT is appropriated increased or decreased to ensure that IDM equals the required value, e.g., 620 nA. For example, the supplied tester current IDVT=0.62 μA and the measured current, ID=1.32 μA. IDM is then equal to 1.32 μA−0.62 μA=0.70 μA. This means that the mirrored current is 0.08 μA higher than required. For correction, the IDVT is lowered by this difference and the new IDVTcorr=0.62 μA−0.08 μA=0.54 μA.

Moreover, the OpAmp 20 can also have an offset which is determined by the circuit. This offset can be, e.g., VDS=VDI+Voffset measurement for two points target values VDI=50 mV (VTLIN) and VDI=1V(VTSAT) for forced VDS with the calibrated output buffer 40 and the calibrated current mirror 45.

Additionally, the circuits described in FIGS. 1 and 3 can check and calibrate VDI (Internal Drain Voltage of DUT's). In embodiments, the differential amplifier (OpAmp) 20 is used to adjust the internal drain voltages. These voltages are supposed to have the same value as VDS, predefined by the tester (VDI=VDS). In reality, though, the values can differ due to the offset voltage of differential amplifier 20. For VDI calibration, only the values VDI=0.05V and VDI=1V are needed. Accordingly, the offset of the output buffer 40 at these points needs to be determined, e.g., Voffs (0.05) and Voffs(1). By way of example, VDS is set to equal 0.05V and CAL is set to equal 1V. VDO(0.05) is then measured at the output pin, VTO, and VDS is set to equal 1V. VDO(1) is then measured at output pin, VTO. VDI(0.05) is then calculated to equal VDO(0.05)−Voffs(0.05) (VDI(0.05)=VDO(0.05)−Voffs(0.05) and VDI(1) is calculated to be VDO(1)−Voffs(1) (VDI(1)=VDO(0.05)−Voffs(0.05)). VDS is then adjusted until the required VDI is reached.

In a more specific example,
(i) The transfer characteristic output buffer delivers: Voffs (0.05)=5 mV, Voffs(1)=6 mV.
(ii) The measured VDO values (CAL=1V) at output VTO are: VDO(0.05)=0.04V and VDO(1)=0.995V.
(iii) The corrected (real) internal drain voltages are: VDI(0.05)=0.04V−0.005V=0.035V    VDI(1)=0.995V−0.006V=0.989V.
(iv) In order to obtain the required VDI values, the external supplied VDS needs to be corrected: VDS(0.05)=65 mv (instead of 50 mV) and VDS(1)=1.011V (instead of 1V).

In embodiments, the voltage VGSI can thus be automatically set/converged to the appropriate voltage in microseconds by using the measured offset of the voltages VDS and VDI. Voltage VGSI is input to the single FET under test in one of the plurality of FET arrays 25a-25n through operation of switch S5. In embodiments, the voltage VGSI is a value defined by implementing the processes and circuit described herein. Specifically, as VGSI→0V, VGS can be adjusted or set in microseconds based on the output VDI of each FET of a selected FET arrays 25a-25n. Also, switch S5 provides the output voltage VGSI of the differential amplifier 20 to the selected FET array 25a-25n.

Figure 5:
FIG. 5 shows a layout of the circuit structure of FIG. 1 or FIG. 3 in accordance with aspects of the present disclosure.

FIG. 5 shows a layout of the circuit structures of FIG. 1 and FIG. 3 in accordance with aspects of the present disclosure. As shown in FIG. 5, for example, the circuit 10 can be realized on a layout with a height which allows inclusion in a 60 um scribe line 50. Accordingly, the circuit 10 can be implemented for parameter tracking in product frame scribes due its appropriate height.

The circuit structures of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit structures of the present disclosure have been adopted from integrated circuit (IC) technology. For example, the structures are built on wafers and are realized in films of material patterned by photolithographic processes on the top of a wafer. In particular, the fabrication of the circuit structures uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The circuit supports production of such circuits. However, it is a test supporting circuit only. It will probably not part of such products.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A circuit comprising a control loop comprised of a differential amplifier, a plurality of field effect transistors (FET) arrays, a first switch enabling connection of an output of the differential amplifier to each of the plurality of FET arrays, a second switch enabling feedback of an output voltage of one or more selected FET arrays of the plurality of FET arrays back to the differential amplifier, and a third switch enabling selection between applying the output of the differential amplifier or the output voltage of the one or more selected FET arrays to an external probe or tester for measurement.

2. The circuit of claim 1, wherein the first, second and third switches are analog switches, and further comprising multiplexors for selection of the plurality of FET arrays and FETs within the plurality of FET arrays.

3. The circuit of claim 2, wherein the plurality of FET arrays are N-type FET arrays or P-type FET arrays.

4. The circuit of claim 2, wherein an input to the differential amplifier includes a target voltage VDS and the output voltage of the one or more selected FET array of the plurality of FET arrays.

5. The circuit of claim 4, wherein the output voltage VDI of the selected one of the plurality of FET arrays is provided as the input to the differential amplifier by operation of the first switch, resulting in a loop system.

6. The circuit of claim 5, wherein an output voltage VGSI of the differential amplifier is supplied as an input voltage to each selected one of the plurality of FET arrays, as selected by a control circuit.

7. The circuit of claim 6, wherein the output voltage VGSI is controlled by the target voltage VDS and the output voltage VDI to converge to "0".

8. The circuit of claim 1, further comprising:
a current mirror to force a well defined drain current (IDI) to each selected FET of each selected FET array of the plurality of FET arrays;
a fourth switch coupled to an output of the current mirror to enable selection of one of the plurality of FET arrays to provide the well-defined drain current to each FET transistor of the selected FET array;
a control circuit coupled to an input of each of the plurality of FET arrays, wherein the control circuit includes a counter and a decoder configured to select individual FETs of each selected FET array of the plurality of FET arrays; and
an output buffer coupled to an output of the third switch to drive measured voltage towards the external probe or tester.

9. The circuit of claim 1, further comprising an output buffer coupled to an output of the third switch to drive measured voltage towards the external probe or tester.

10. The circuit of claim 9, wherein an offset voltage is used for measurement value compensation within a loop settling time of the control loop.

11. The circuit of claim 10, wherein the offset voltage is a measured offset of a known input value VDS of the differential amplifier and an output voltage VDI of a selected FET array of the plurality of FET arrays.

12. A control circuit, comprising:
a differential amplifier;
a plurality of FET arrays whose voltage input VGSI is an output of the differential amplifier and whose output voltage VDI is provided as an input to the differential amplifier along with a target input VDS;
an array control circuit structured to select a FET array of the plurality of FET arrays in order to receive the voltage input VGSI;
a transistor control circuit structured to provide control signals to select each transistor of the selected FET array;
a first switch enabling connection of an output of the differential amplifier to each of the plurality of FET arrays;
a second switch enabling feedback of an output voltage of one or more selected FET arrays of the plurality of FET arrays back to the differential amplifier;
a third switch enabling selection between applying the output of the differential amplifier or the output voltage of the one or more selected FET arrays to an external probe or tester for measurement; and a fourth switch enabling selection of one of the plurality of FET arrays to provide a well-defined drain current to each FET transistor of the selected FET array.

13. The control circuit of claim 12, wherein the differential amplifier amplifies a difference between the output voltage VDI and the target input VDS by a constant factor to output the voltage input VGSI.

14. The control circuit of claim 13, wherein the first, second, third and fourth switches are analog switches, and wherein the second switch feeds the output voltage VDI of the selected FET array back to the differential amplifier resulting in a loop system.

15. The control circuit of claim 14, further comprising an output buffer coupled to an output of the third switch and structured to appropriately drive measured voltage towards the external probe or tester.

16. The control circuit of claim 15, further comprising calibrating the output voltage VDI.

17. The control circuit of claim 16, further comprising a current mirror coupled to provide an input to the fourth switch and having a current that is calibrated to the well defined current which is forced to each FET at least one of the plurality of FET arrays.

18. The control circuit of claim 15, wherein the control circuit is placed in a common digital to analog converter/analog to digital converter (DAC/ADC) interface.

19. A circuit, comprising:
a differential amplifier;
a plurality of FET arrays connected to an output of the differential amplifier by a first switch and an output voltage of the plurality of FET arrays connected to an input of the differential amplifier by a second switch;
at least one control circuit structured to select a FET array of the plurality of FET arrays and particular transistors in the selected FET array to receive a voltage input VGSI, wherein the voltage input VGSI is an output of the differential amplifier defined by an output voltage VDI of the selected FET array and a target input VDS; and
a third switch enabling selection between applying the output of the differential amplifier or the output voltage of the one or more selected FET arrays to an external probe or tester for measurement,
wherein the first switch, the second switch and the third switch are structured to ensure leakage current minimization to an amount which does not impact desired measurement precision.

20. The circuit of claim 19, further comprising:
a current mirror to force a well defined drain current (IDI) to each selected FET of each selected FET array of the plurality of FET arrays, the well defined current being calibrated by using input current and target current measurements; and
an output buffer coupled to the third switch, wherein the output buffer is structured to drive a measured value of output voltage VDI and the voltage input VGSI to the external tester or probe.

* * * * *